(12) United States Patent
Jeon et al.

(10) Patent No.: US 9,171,795 B2
(45) Date of Patent: Oct. 27, 2015

(54) INTEGRATED CIRCUIT PACKAGING SYSTEM WITH EMBEDDED COMPONENT AND METHOD OF MANUFACTURE THEREOF

(71) Applicants: Dong Ju Jeon, Seoul (KR); KyoungHee Park, Seoul (KR); YoungDal Roh, Icheon-si (KR); JinHee Jung, Busan (KR)

(72) Inventors: Dong Ju Jeon, Seoul (KR); KyoungHee Park, Seoul (KR); YoungDal Roh, Icheon-si (KR); JinHee Jung, Busan (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/556,992

(22) Filed: Dec. 1, 2014

(65) Prior Publication Data
US 2015/0171002 A1    Jun. 18, 2015

Related U.S. Application Data

(60) Provisional application No. 61/916,405, filed on Dec. 16, 2013.

(51) Int. Cl.
| | | |
|---|---|---|
| H01L 21/4763 | (2006.01) |
| H01L 23/04 | (2006.01) |
| H05K 1/18 | (2006.01) |
| H01L 23/498 | (2006.01) |
| H01L 21/52 | (2006.01) |
| H01L 21/48 | (2006.01) |
| H01L 21/768 | (2006.01) |
| H01L 23/538 | (2006.01) |
| H01L 23/48 | (2006.01) |
| H01L 23/522 | (2006.01) |
| H01L 25/065 | (2006.01) |

(52) U.S. Cl.
CPC ........ *H01L 23/49861* (2013.01); *H01L 21/481* (2013.01); *H01L 21/4803* (2013.01); *H01L 21/486* (2013.01); *H01L 21/4821* (2013.01); *H01L 21/52* (2013.01); *H01L 21/76877* (2013.01); *H01L 21/76898* (2013.01); *H01L 23/481* (2013.01); *H01L 23/49822* (2013.01); *H01L 23/49827* (2013.01); *H01L 23/5226* (2013.01); *H01L 23/5386* (2013.01); *H01L 21/76804* (2013.01); *H01L 25/0657* (2013.01)

(58) Field of Classification Search
CPC . H01L 23/5226; H01L 21/52; H01L 23/5386; H01L 21/76877; H01L 21/481; H01L 21/76804; H01L 23/49822; H01L 21/76898; H01L 21/486; H01L 23/5384; H01L 23/3107; H01L 23/49838; H01L 23/53295
See application file for complete search history.

(56) References Cited

U.S. PATENT DOCUMENTS

| | | | |
|---|---|---|---|
| 7,274,099 B2 | 9/2007 | Hsu | |
| 7,968,991 B2 * | 6/2011 | Wong et al. | 257/686 |
| 8,698,278 B2 * | 4/2014 | Muramatsu | 257/532 |
| 8,884,443 B2 | 11/2014 | Chen et al. | |
| 2005/0124148 A1 * | 6/2005 | Tuominen | 438/618 |
| 2007/0206366 A1 * | 9/2007 | Tuominen | 361/764 |
| 2010/0014261 A1 * | 1/2010 | Inagaki et al. | 361/763 |

(Continued)

*Primary Examiner* — Alonzo Chambliss
(74) *Attorney, Agent, or Firm* — Ishimaru & Associates LLP

(57) ABSTRACT

An integrated circuit packaging system, and a method of manufacture of an integrated circuit packaging system thereof, including: an embedding material on a component; a mask layer on the embedding material; a buried pattern in the mask layer, the outer surface of the buried pattern coplanar with the outer surface of the mask layer, the buried pattern electrically connected to the component; a patterned dielectric on a portion of the buried pattern; and an integrated circuit die on the buried pattern.

20 Claims, 7 Drawing Sheets

(56) References Cited

U.S. PATENT DOCUMENTS

| | | | |
|---|---|---|---|
| 2010/0032827 A1* | 2/2010 | Hsu | 257/692 |
| 2011/0163437 A1* | 7/2011 | Shin et al. | 257/698 |
| 2012/0161331 A1* | 6/2012 | Gonzalez et al. | 257/774 |
| 2013/0105991 A1* | 5/2013 | Gan et al. | 257/777 |
| 2013/0176692 A1 | 7/2013 | Haslebner et al. | |
| 2013/0285254 A1* | 10/2013 | Kainuma et al. | 257/774 |
| 2014/0042638 A1* | 2/2014 | Liu et al. | 257/774 |

* cited by examiner

INTEGRATED CIRCUIT PACKAGING SYSTEM WITH EMBEDDED COMPONENT AND METHOD OF MANUFACTURE THEREOF

CROSS-REFERENCE TO RELATED APPLICATION(S)

This application claims the benefit of U.S. Provisional Patent Application Ser. No. 61/916,405 filed Dec. 16, 2013, and the subject matter thereof is incorporated herein by reference thereto.

TECHNICAL FIELD

The present invention relates generally to an integrated circuit packaging system, and more particularly to a system with an embedded electronic component.

BACKGROUND ART

Ongoing goals of the computer industry are increased miniaturization of components, greater packaging density of integrated circuits ("ICs"), higher performance, and lower cost. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for a method of manufacture of a support system providing integration, space savings, and low cost manufacturing. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system of an integrated circuit packaging system that includes forming an embedding material on a passive device; depositing a dry film layer on the embedding material; patterning the dry film layer; depositing a buried pattern in the dry film layer, the outer surface of the buried pattern coplanar with the outer surface of the dry film layer, the buried pattern electrically connected to the passive device; forming a patterned dielectric on a portion of the buried pattern; and mounting an integrated circuit die on the buried pattern.

The present invention provides an integrated circuit packaging system that includes an embedding material on a passive device; a dry film layer on the embedding material; a buried pattern in the dry film layer, the outer surface of the buried pattern coplanar with the outer surface of the dry film layer, the buried pattern electrically connected to the passive device; a patterned dielectric on a portion of the buried pattern; and an integrated circuit die on the buried pattern.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
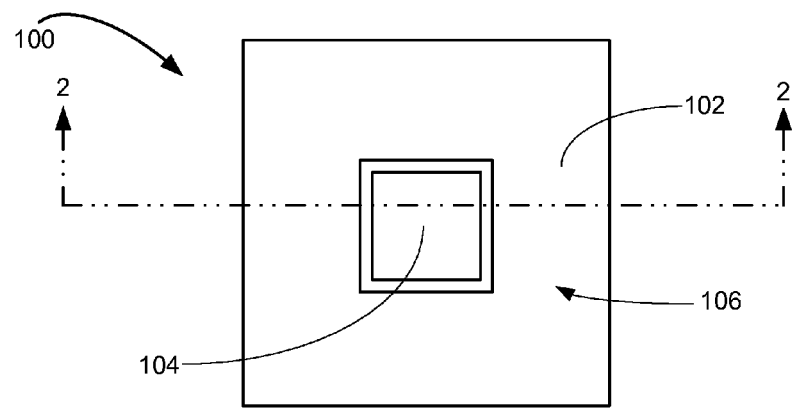
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the lowest conductive pattern, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view shows a portion of an embedded component substrate 102 with an integrated circuit die 104 mounted on the top of the embedded component substrate 102. It is understood that more die may be mounted on the embedded component substrate 102 as required, but only one is shown for illustrative purposes. Other features such as exposed pads or traces are also omitted for clarity. A top surface 106 of the embedded component substrate 102 can be seen around the integrated circuit die 104.

Figure 2:
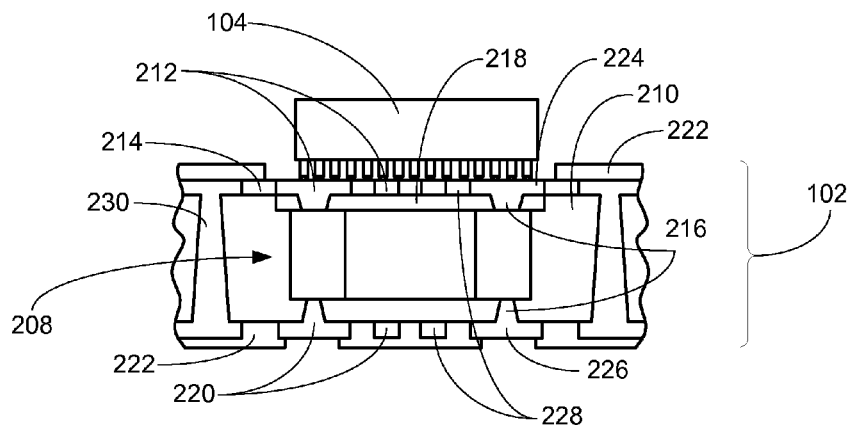
FIG. 2 is a cross-sectional view of a portion of the integrated circuit packaging system of FIG. 1 along the section line 2-2.

Referring now to FIG. 2, therein is shown a cross-sectional view of a portion of the integrated circuit packaging system 100 of FIG. 1 along the section line 2-2. The integrated circuit die 104 and the embedded component substrate 102 are shown. The embedded component substrate 102 includes a component 208 as the embedded component, which is in direct contact with and surrounded by embedding material 210, which can be pre-impregnated material (PPG), for example. The component 208 can be an active or a passive device, such as an integrated circuit die, a capacitor, or a resistor, for example.

Above the component 208 embedded in the embedding material 210 is a buried pattern 212, which is a conductive pattern buried in a mask layer 214 such that the outer surface of the buried pattern 212 is coplanar with the outer surface of the mask layer 214. The mask layer 214 can be a photoresist, a dry film, or a photo imageable dielectric, for example. The integrated circuit die 104 is connected to the component 208 through the buried pattern 212, which is connected to the component 208 through embedded component vias 216 extending down to directly contact the component 208 through a device adhesive 218.

Below the component 208 is a conductive pattern 220 which sits on and outside of the embedding material 210. The embedded component vias 216 connect the component 208 to the conductive pattern 220. It has been found that the buried pattern 212 can have pads, lines, traces, and vias in the same pattern as with a conductive pattern built on the surface of a dielectric, so there is no loss of routing capability with the buried pattern 212.

A patterned dielectric 222 such as solder resist covers portions of the buried pattern 212 and the conductive pattern 220 to protect non-contact areas from corrosion, inadvertent electrical shorts, or other unwanted external forces. Some of the buried contact pads 224 of the buried pattern 212 and outer layer contact pads 226 of the conductive pattern 220 are exposed through the patterned dielectric 222. Traces 228 connect the various contact pads of the respective conductive patterns, though only a portion of the traces 228 are shown.

In some portions of the embedded component substrate 102, buried contact pads 224 are directly connected to the outer layer contact pads 226 through vertical vias 230 which pass through the embedding material 210. This direct connection between the buried contact pads 224 and the outer layer contact pads 226 allows for greater routing flexibility of electrical signals, for example. In this example, the vertical vias 230 and the embedded component vias 216 are tapered with one end thinner than the other, but it is understood that this is for illustrative purposes only. For example, the vertical vias 230 can be the same thickness throughout if done through mechanical drilling as opposed to laser drilling.

It has been discovered that the buried pattern 212 in the mask layer 214 allows for fine pitch control between the traces 228 and the buried contact pads 224 and between other traces. For example, the conductive pattern wires or traces can have a line width (LW) or wire width (WW) and a line space between lines (also called L/S) of 15 micrometers (um) and 15 um (15/15), respectively, by using the mask layer 214 to help create the buried pattern 212. The term fine pitch refers to LW/LS of 15/15 um or smaller.

It has also been discovered that attaching the integrated circuit die 104 directly above the component 208 improves electrical performance compared to having both components surface mounted. Because of the shorter and more direct electrical path between the integrated circuit die 104 and the component 208 through the buried pattern 212 and the embedded component vias 216, for example, there is a large reduction in voltage noise and a drop in impedance, which can also lower power requirements.

Figure 3:
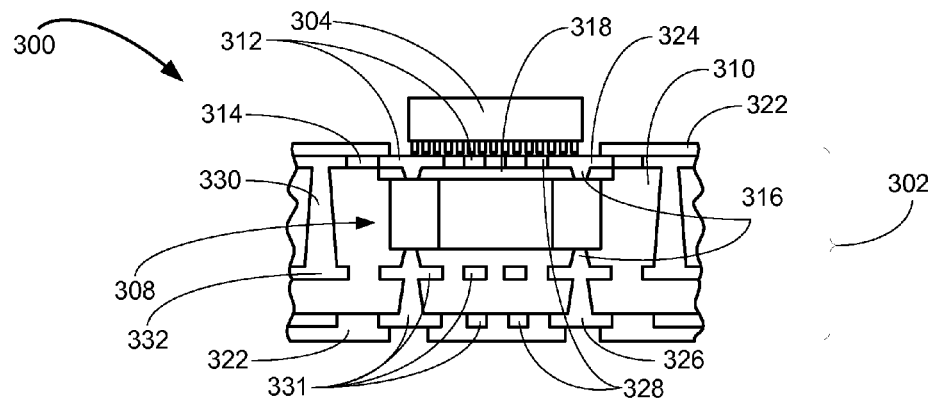
FIG. 3 is a cross-sectional view of the integrated circuit packaging system in a second embodiment of the present invention.

Referring now to FIG. 3, therein is shown a cross-sectional view of the integrated circuit packaging system 300 in a second embodiment of the present invention. The integrated circuit die 304 and the embedded component substrate 302 are shown. The embedded component substrate 302 includes a component 308 as the embedded component, which is in direct contact with and surrounded by embedding material 310, which can be pre-impregnated material (PPG), for example. The component 208 can be an active or a passive device, such as an integrated circuit die, a capacitor, or a resistor, for example.

Above the component 308 embedded in the embedding material 310 is a buried pattern 312, which is a conductive pattern buried in a mask layer 314 such that the outer surface of the buried pattern 312 is coplanar with the outer surface of the mask layer 314. The mask layer 214 can be a photoresist, a dry film, or a photo imageable dielectric, for example.

The integrated circuit die 304 is connected to the component 308 through the buried pattern 312, which is connected to the component 308 through embedded component vias 316 extending down to directly contact the component 308 through a device adhesive 318.

Below the component 308 is a layered conductive pattern 331 with an outer layer on and outside of the embedding material 310, and an inner layer fully covered by the embedding material 310. The embedded component vias 316 connect the component 308 to the layered conductive pattern 331. The layered conductive pattern 331 is shown as a two-layer structure connected through internal vias, though it is understood that any number of layers as required may be used. For example, the layered conductive pattern 331 can be three or more layers to add to routing flexibility.

A patterned dielectric 322 such as solder resist covers portions of the buried pattern 312 and the outer layer of the layered conductive pattern 331 to protect non-contact areas from corrosion, inadvertent electrical shorts, or other unwanted external forces. Buried contact pads 324 of the buried pattern 312 and outer layer contact pads 326 of the layered conductive pattern 331 are exposed through the patterned dielectric 322. Traces 328 connect the various contact pads of the respective conductive patterns, though only a portion of the traces 328 are shown.

In some portions of the embedded component substrate 302, buried contact pads 324 are directly connected to inner layer contact pads 332 through vertical vias 330 which pass through a portion of the embedding material 310. This direct connection between the buried contact pads 324 and the inner layer contact pads 332 allows for greater routing flexibility of electrical signals, for example. In this example, the vertical vias 330 are tapered with one end of the vertical vias 330 thinner than the other, but it is understood that this is for illustrative purposes only. For example, the vertical vias 330 can be the same thickness throughout if done through mechanical drilling as opposed to laser drilling.

Internal vias connect some of the inner layer contact pads 332 to the outer layer contact pads 326 and it is understood that the location of the internal vias can be adjusted as necessary for routing requirements. The traces 328 of the outer layer of the layered conductive pattern 331 can be covered by the patterned dielectric 322.

Figure 4:
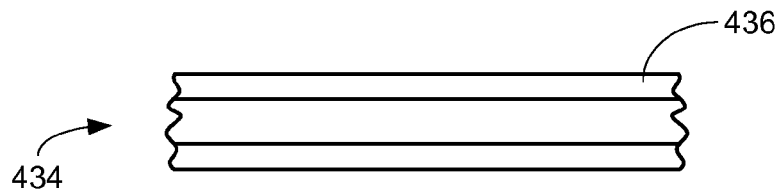
FIG. 4 is the integrated circuit packaging system of FIG. 2 in a beginning phase of manufacture.

Referring now to FIG. 4, therein is shown the integrated circuit packaging system 100 of FIG. 2 in a beginning phase of manufacture. A two-sided carrier 434 can be seen, where a conductive layer 436 such as copper, can be seen on both sides of the two-sided carrier 434. The two-sided carrier 434 can be a copper clad laminate (CCL) with a dielectric core, for example.

Figure 5:
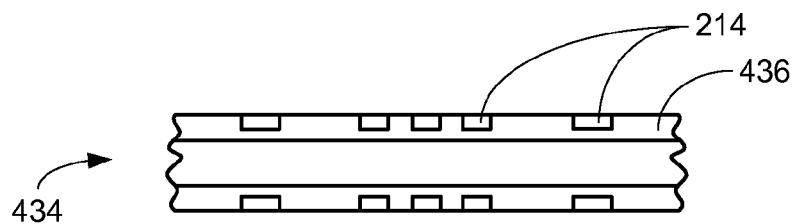
FIG. 5 is the structure of FIG. 4 in a first plating phase of manufacture.

Referring now to FIG. 5, therein is shown the structure of FIG. 4 in a first plating phase of manufacture. The mask layer 214 is applied to the conductive layer 436 and patterned for the deposition of what will become the buried pattern 212 of FIG. 2. The material used for the buried pattern 212 can be the same as the material of the conductive layer 436, for example. In all steps using the two-sided carrier 434, it is understood that the description of the process is performed on both sides of the two-sided carrier 434.

It has been found that the various embodiments of the present invention in forming the integrated circuit packaging system 100 provide material cost reduction by allowing replacement of copper clad laminate (CCL) with PPG laminates for the embedding material 210 of FIG. 2. It has also been found that the use of the two-sided carrier 434 and simultaneous processing on both sides provides suppression of high temperature strip warpage due to having a symmetric structure.

It has also been discovered that the use of the mask layer 214 for forming the buried pattern 212 can increase reliability and reduce the possibility of void traps. There is less risk of void formation when an adhesive insulator is coated or printed on the buried pattern 212 which is coplanar with the mask layer 214. By using a photo imageable pattern protective material around the conductive pattern, the adhesive insulator can be coated or printed on a smoother surface to lower or eliminate the risk of void traps, for example. Voids in the substrate or package are one of the major root causes of reliability issues.

Figure 6:
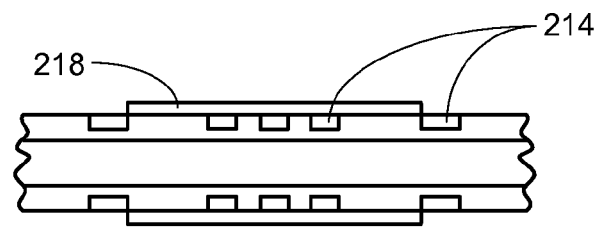
FIG. 6 is the structure of FIG. 5 in an adhesive deposition phase of manufacture.

Referring now to FIG. 6, therein is shown the structure of FIG. 5 in an adhesive deposition phase of manufacture. The device adhesive 218 is deposited on the mask layer 214 and the buried pattern 212 in preparation for mounting of the component 208 of FIG. 2. The deposition can be through a process such as printing or coating, for example.

Figure 7:
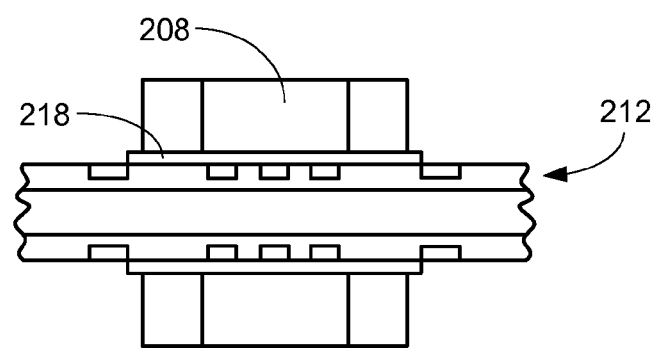
FIG. 7 is the structure of FIG. 6 in a passive device attach phase of manufacture.

Referring now to FIG. 7, therein is shown the structure of FIG. 6 in a passive device attach phase of manufacture. The component 208 is attached to the buried pattern 212 through the device adhesive 218. The device adhesive 218 is horizontally larger than the component 208.

Figure 8:
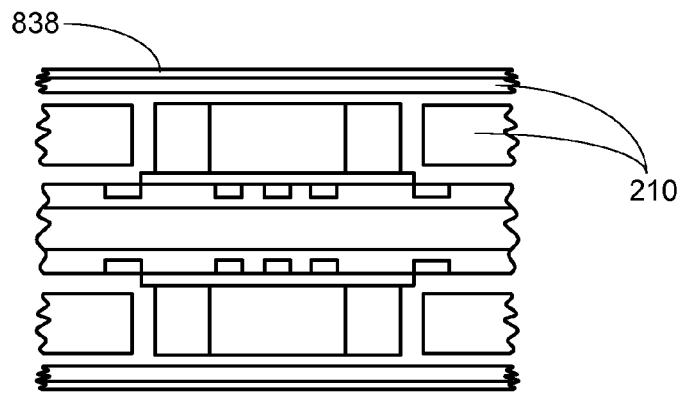
FIG. 8 is the structure of FIG. 7 in a lamination phase of manufacture.

Referring now to FIG. 8, therein is shown the structure of FIG. 7 in a lamination phase of manufacture. In this phase, the embedding material 210 and a base conductive material 838 of which a portion will become the conductive pattern 220 of FIG. 2 are deposited. The deposition or lamination process can occur in various ways and the separation between portions of the embedding material 210 is shown for clarity only.

Figure 9:
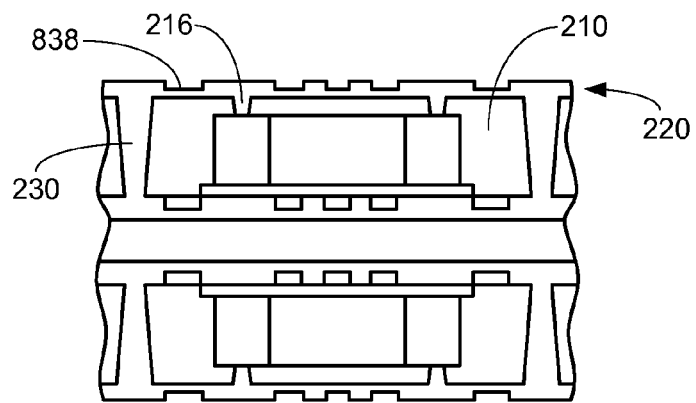
FIG. 9 is the structure of FIG. 8 in a first patterning phase of manufacture.

Referring now to FIG. 9, therein is shown the structure of FIG. 8 in a first patterning phase of manufacture. The conductive pattern 220 can be patterned on top of the base conductive material 838 on the embedding material 210 through a process such as masking and plating, for example. Prior to the conductive pattern 220 being formed, the embedded component vias 216 and the vertical vias 230 can be formed through a process such as drilling (laser or mechanical) or etching followed by deposition of conductive material. The embedded component vias 216 and the vertical vias 230 can be formed through the base conductive material 838 and the embedding material 210. The deposition can be done through plating, for example. The conductive pattern 220 can then be patterned to contact the vertical vias 230, the embedded component vias 216, and the base conductive material 838.

Figure 10:
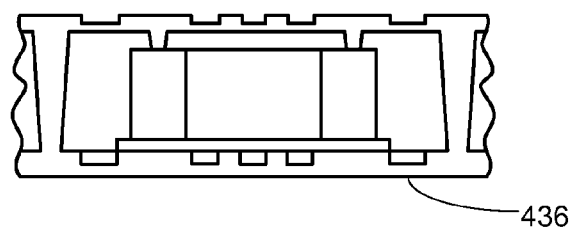
FIG. 10 is the structure of FIG. 9 in a detaching phase of manufacture.

Referring now to FIG. 10, therein is shown the structure of FIG. 9 in a detaching phase of manufacture. In this phase, the conductive layer 436 can be detached from the core of the two-sided carrier 434 of FIG. 4. It is understood that structures on both sides of the two-sided carrier 434 can be processed in the same manner, which is described following this figure. It is also understood that this figure and those that follow show a structure which is flipped upside-down when compared to the integrated circuit packaging system 100 of FIG. 2. It is understood that the orientation of the structures shown are for example only, and processes are not limited to the shown orientation.

Figure 11:
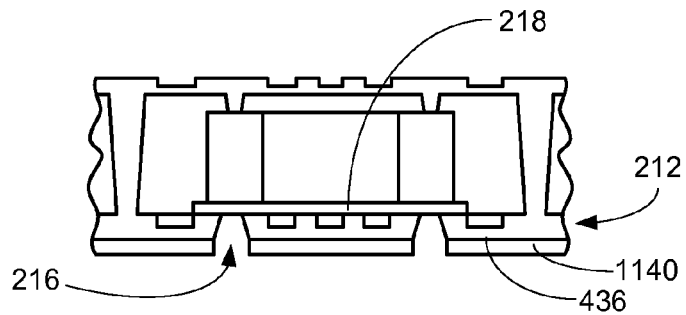
FIG. 11 is the structure of FIG. 10 in a via formation phase of manufacture.

Referring now to FIG. 11, therein is shown the structure of FIG. 10 in a via formation phase of manufacture. In this phase, the embedded component vias 216 are formed through the conductive layer 436 and the buried pattern 212 through a process such as etching or drilling. In this example, a patterned mask 1140 is used for conformal etching through the conductive material, but stopping at the device adhesive 218.

Figure 12:
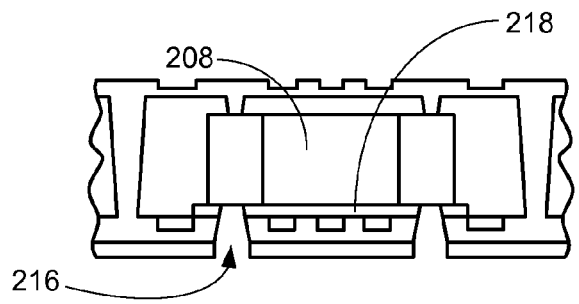
FIG. 12 is the structure of FIG. 11 in a via opening phase of manufacture.

Referring now to FIG. 12, therein is shown the structure of FIG. 11 in a via opening phase of manufacture. In this phase, the embedded component vias 216 are completed by opening holes in the device adhesive 218 to expose contacts of the component 208. In this example, the device adhesive 218 is opened by laser drilling.

Figure 13:
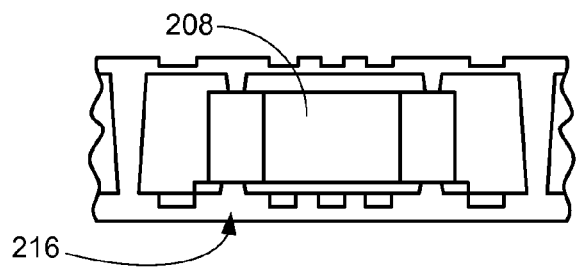
FIG. 13 is the structure of FIG. 12 in a deposition phase of manufacture.

Referring now to FIG. 13, therein is shown the structure of FIG. 12 in a deposition phase of manufacture. The embedded component vias 216 through the device adhesive 218 are filled with conductive material which contacts the component 208 directly, such as copper. Additionally, the patterned mask 1140 of FIG. 11 is removed after the embedded component vias 216 are filled.

Figure 14:
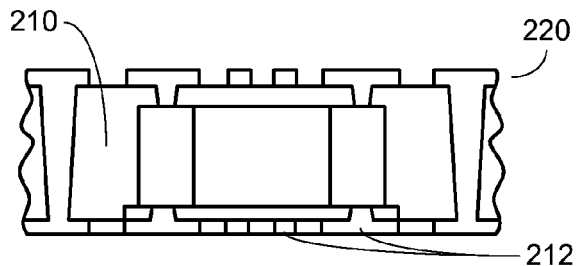
FIG. 14 is the structure of FIG. 13 in a removal phase of manufacture.

Referring now to FIG. 14, therein is shown the structure of FIG. 13 in a removal phase of manufacture. The conductive layer 436 of FIG. 4 and the base conductive material 838 of FIG. 8 are removed, fully forming the buried pattern 212 and the conductive pattern 220. The removal can be through a method such as etching, for example.

Following the removal phase, the patterned dielectric 222 of FIG. 2 is deposited on the buried pattern 212, the conductive pattern 220, and the embedding material 210. This completes the formation of the embedded component substrate 102 of FIG. 2. The integrated circuit die 104 of FIG. 2 is mounted on the embedded component substrate 102 to complete the integrated circuit packaging system 100 of FIG. 2.

It has been discovered that forming the buried pattern 212 through the use of the mask layer 214 reduces manufacturing defects, thereby increasing yield and reliability. It had been found that previous via on bump (VOB) structures had uneven dimples in the conductive pattern above the vias because of uneven plating. With the buried pattern 212 having a surface coplanar with the mask layer 214, it becomes much easier to form the VOB structures as flat, reducing the incidence of defects.

Figure 15:
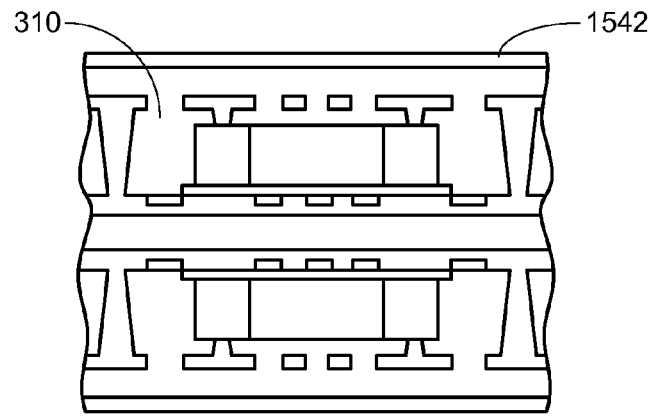
FIG. 15 is the structure of FIG. 9 in an alternative layering phase of manufacture for manufacturing the integrated circuit packaging system of FIG. 3.

Referring now to FIG. 15, therein is shown the structure of FIG. 9 in an alternative layering phase of manufacture for manufacturing the integrated circuit packaging system 300 of FIG. 3. In this phase, etching is done to remove the base conductive material 838 of FIG. 8, and another layer of the embedding material 310 is laminated on top of the conductive pattern which will become the inner layer of the layered conductive pattern 331 of FIG. 3. An outer base conductive layer 1542 can then be deposited on the embedding material 310.

Figure 16:
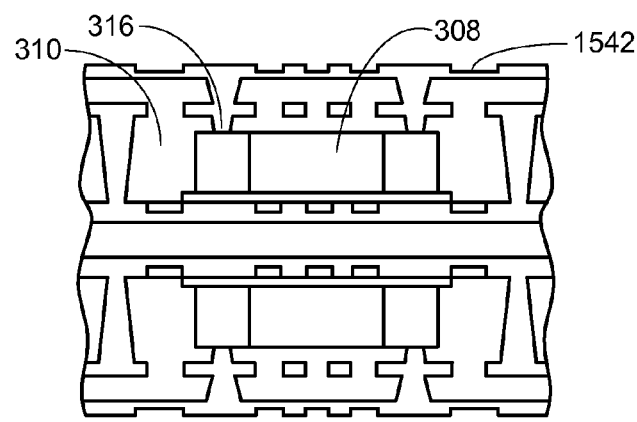
FIG. 16 is the structure of FIG. 15 in a via formation phase of manufacture.

Referring now to FIG. 16, therein is shown the structure of FIG. 15 in a via formation phase of manufacture. Internal vias can be created in the embedding material 310 and through the outer base conductive layer 1542 to line up with the embedded component vias 316 which are connected to the component 308. The internal vias can then be filled in with a conductive material such as copper while simultaneously patterning the outer layer of the layered conductive pattern 331 on the surface of the outer base conductive layer 1542. It is understood that filling in the internal vias and depositing the outer layer of the layered conductive pattern 331 can be done simultaneously or separately.

Figure 17:
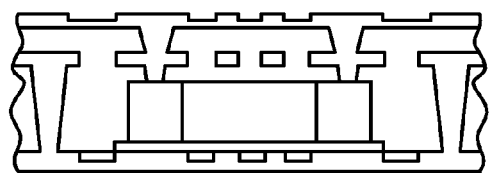
FIG. 17 is the structure of FIG. 16 in a detaching phase of manufacture.

Referring now to FIG. 17, therein is shown the structure of FIG. 16 in a detaching phase of manufacture. The structure is shown in a flipped orientation as compared to the orientation of the integrated circuit packaging system 300 of FIG. 3, but it is understood that the orientation is shown for illustration only, and any orientation is possible.

Figure 18:
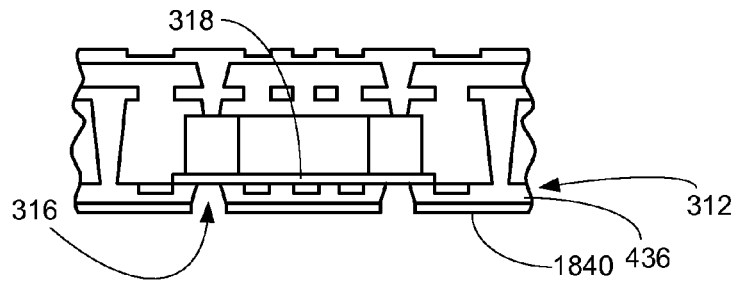
FIG. 18 is the structure of FIG. 17 in a further via formation phase of manufacture.

Referring now to FIG. 18, therein is shown the structure of FIG. 17 in a further via formation phase of manufacture. In this phase, the embedded component vias 316 are formed through the conductive layer 436 and the buried pattern 312 through a process such as etching or drilling. In this example, a patterned mask 1840 is used for conformal etching through the conductive material, but stopping at the device adhesive 318.

Figure 19:
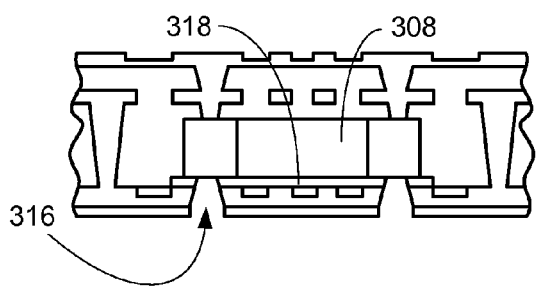
FIG. 19 is the structure of FIG. 18 in a via opening phase of manufacture.

Referring now to FIG. 19, therein is shown the structure of FIG. 18 in a via opening phase of manufacture. In this phase, the embedded component vias 316 are completed by opening holes in the device adhesive 318 to expose contacts of the component 308. In this example, the device adhesive 318 is opened by laser drilling.

Figure 20:
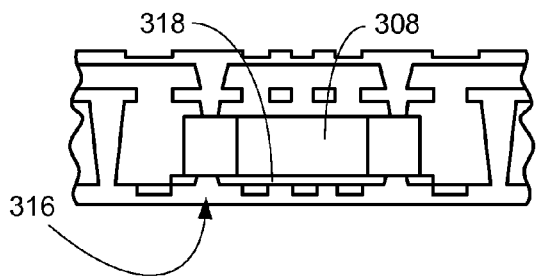
FIG. 20 is the structure of FIG. 19 in a deposition phase of manufacture.

Referring now to FIG. 20, therein is shown the structure of FIG. 19 in a deposition phase of manufacture. The embedded component vias 316 through the device adhesive 318 are filled with conductive material which contacts the component 308 directly, such as copper. The patterned mask 1840 can be removed after filling of the embedded component vias 316.

Figure 21:
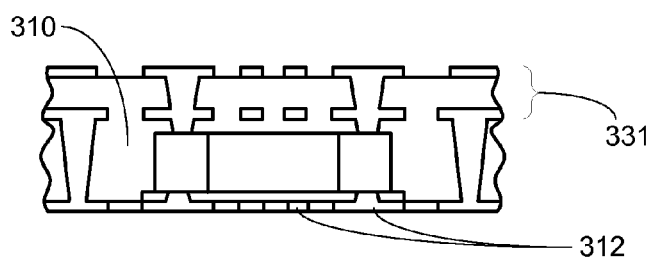
FIG. 21 is the structure of FIG. 20 in a removal phase of manufacture.

Referring now to FIG. 21, therein is shown the structure of FIG. 20 in a removal phase of manufacture. The conductive layer 436 of FIG. 4 and the base conductive material 838 of FIG. 8 are removed, fully forming the buried pattern 312 and the layered conductive pattern 331. The removal can be through a method such as etching, for example.

Following the removal phase, the patterned dielectric 322 of FIG. 3 is deposited on the buried pattern 312, the layered conductive pattern 331, and the embedding material 310. This completes the formation of the embedded component substrate 302 of FIG. 3. The mounting of the integrated circuit die 304 of FIG. 3 completes the integrated circuit packaging system 300 of FIG. 3.

It has been discovered that the coreless process flow described above for the formation of the integrated circuit packaging system 300 allows for easy extension of the layers of the layered conductive pattern 331. Because the embedding material 310 is built up to only the necessary thickness and additional thickness can be added easily, additional layers of the layered conductive pattern 331 are relatively simple to add by adding another layer of the embedding material 310 and then patterning a conductive layer on top. This allows for greater routing options at only a small increase in costs.

Figure 22:
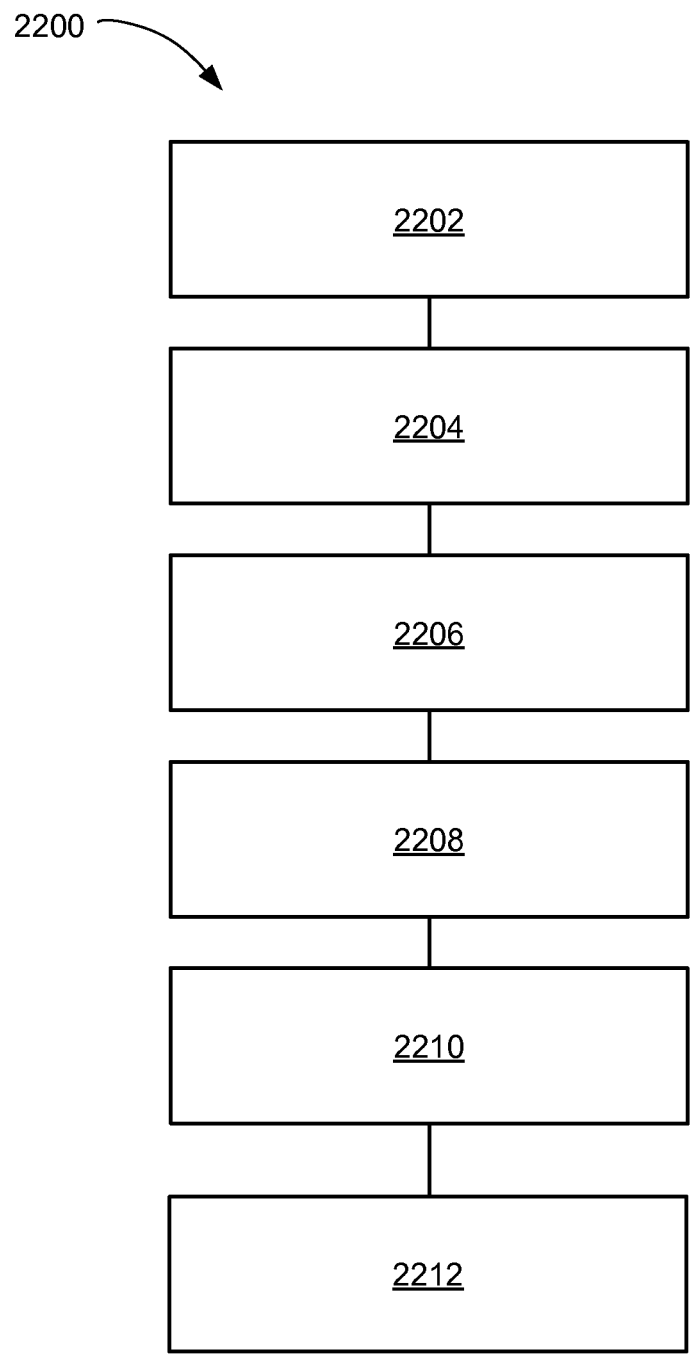
FIG. 22 is a flow chart of a method of manufacture of the integrated circuit packaging system in a further embodiment of the present invention.

Referring now to FIG. 22, therein is shown a flow chart of a method 2200 of manufacture of the integrated circuit packaging system 100 in a further embodiment of the present invention. The method 2200 includes: forming an embedding material on a passive device in a block 2202; depositing a dry film layer on the embedding material in a block 2204; patterning the dry film layer in a block 2206; depositing a buried pattern in the dry film layer, the outer surface of the buried pattern coplanar with the outer surface of the dry film layer, the buried pattern electrically connected to the passive device in a block 2208; forming a patterned dielectric on a portion of the buried pattern in a block 2210; and mounting an integrated circuit die on the buried pattern in a block 2212.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming an embedding material on a component;
    depositing a mask layer on the embedding material;
    patterning the mask layer;
    depositing a buried pattern in the mask layer, the outer surface of the buried pattern coplanar with the outer surface of the mask layer, the buried pattern electrically connected to the component;
    forming a patterned dielectric on a portion of the buried pattern; and
    mounting an integrated circuit die on the buried pattern.

2. The method as claimed in claim 1 wherein the embedding material is a pre-impregnated material.

3. The method as claimed in claim 1 wherein:
    depositing the buried pattern includes depositing the buried pattern having buried contact pads; and
    forming the patterned dielectric includes forming the patterned dielectric leaving the buried contact pads exposed.

4. The method as claimed in claim 1 further comprising forming a conductive pattern on the embedding material, the conductive pattern electrically connected to the component on a side of the component opposite the buried pattern.

5. The method as claimed in claim 1 further comprising forming embedded component vias for electrically connecting the buried pattern to the component.

6. A method of manufacture of an integrated circuit packaging system comprising:
    forming an embedding material on a component;
    depositing a mask layer on the embedding material;
    patterning the mask layer;
    depositing a buried pattern having buried contact pads in the mask layer, the outer surface of the buried pattern coplanar with the outer surface of the mask layer;
    forming embedded component vias for electrically connecting the buried pattern to the component;
    forming a layered conductive pattern on the embedding material, the layered conductive pattern having an inner layer and an outer layer, the layered conductive pattern electrically connected to the component on a side of the component opposite the buried pattern;
    forming a patterned dielectric on a portion of the buried pattern and the outer layer of the layered conductive pattern, the buried contact pads exposed through the patterned dielectric; and
    mounting an integrated circuit die on the buried contact pads.

7. The method as claimed in claim 6 further comprising forming internal vias for connecting the inner layer and the outer layer of the layered conductive pattern.

8. The method as claimed in claim 6 wherein forming the layered conductive pattern includes forming the layered conductive pattern having the outer layer having outer layer contact pads.

9. The method as claimed in claim 6 wherein forming the embedded component vias includes using laser drilling.

10. The method as claimed in claim 6 wherein forming the patterned dielectric includes depositing and patterning solder resist.

11. An integrated circuit packaging system comprising:
    an embedding material on a component;
    a mask layer on the embedding material;
    a buried pattern in the mask layer, the outer surface of the buried pattern coplanar with the outer surface of the mask layer, the buried pattern electrically connected to the component;
    a patterned dielectric on a portion of the buried pattern; and
    an integrated circuit die on the buried pattern.

12. The system as claimed in claim 11 wherein the embedding material is a pre-impregnated material.

13. The system as claimed in claim 11 wherein the buried pattern has buried contact pads exposed through the patterned dielectric.

14. The system as claimed in claim 11 further comprising a conductive pattern on the embedding material, the conductive pattern electrically connected to the component on a side of the component opposite the buried pattern.

15. The system as claimed in claim 11 further comprising embedded component vias electrically connecting the buried pattern to the component.

16. The system as claimed in claim 11 further comprising:
    a layered conductive pattern on the embedding material, the layered conductive pattern electrically connected to the component on a side of the component opposite the buried pattern;
    embedded component vias electrically connecting the buried pattern to the component; and
wherein:
    the buried pattern has buried contact pads exposed through the patterned dielectric.

17. The system as claimed in claim 16 further comprising internal vias connecting the inner layer and the outer layer of the layered conductive pattern.

18. The system as claimed in claim 16 wherein the layered conductive pattern has the outer layer having outer layer contact pads.

19. The system as claimed in claim 16 wherein the embedded component vias have a tapered shape.

20. The system as claimed in claim 16 wherein the patterned dielectric is solder resist.

* * * * *